(12) United States Patent
Suzuki

(10) Patent No.: US 10,446,370 B2
(45) Date of Patent: Oct. 15, 2019

(54) CHARGED PARTICLE BEAM APPARATUS AND METHOD FOR CONTROLLING CHARGED BEAM APPARATUS

(71) Applicant: HITACHI HIGH-TECH SCIENCE CORPORATION, Minato-ku, Tokyo (JP)

(72) Inventor: Hidekazu Suzuki, Tokyo (JP)

(73) Assignee: HITACHI HIGH-TECH SCIENCE CORPORATION (JP)

( * ) Notice: Subject to any disclaimer, the term of this patent is extended or adjusted under 35 U.S.C. 154(b) by 0 days.

(21) Appl. No.: 15/850,647

(22) Filed: Dec. 21, 2017

(65) Prior Publication Data

US 2018/0182596 A1    Jun. 28, 2018

(30) Foreign Application Priority Data

Dec. 22, 2016 (JP) .................... 2016-249465

(51) Int. Cl.
*H01J 37/304* (2006.01)
*H01J 37/244* (2006.01)
*H01J 37/26* (2006.01)
H01J 37/28 (2006.01)

(52) U.S. Cl.
CPC .......... *H01J 37/304* (2013.01); *H01J 37/244* (2013.01); *H01J 37/265* (2013.01); *H01J 37/28* (2013.01); *H01J 2237/30416* (2013.01); *H01J 2237/31749* (2013.01)

(58) Field of Classification Search
CPC .......... H01J 37/304; H01J 37/28; H01J 37/26; H01J 37/244
USPC .......... 250/306, 307, 309, 310, 311
See application file for complete search history.

(56) References Cited

U.S. PATENT DOCUMENTS 6,118,122 A        9/2000   Koyama et al. ............... 250/309
2011/0147586 A1*  6/2011   Fukuda ................. H01J 37/153
                                                               250/310

FOREIGN PATENT DOCUMENTS

JP            10106474         4/1998

* cited by examiner

Primary Examiner — Nicole M Ippolito
(74) *Attorney, Agent, or Firm* — Adams & Wilks

(57) ABSTRACT

A charged particle beam apparatus includes: an irradiation unit that irradiates a sample with a charged particle beam; an image formation section that detects a charged particle generated from the sample due to the irradiation with the charged particle beam and forms an image based on a signal obtained by detecting the charged particle; an input reception unit that receives an observation condition; a derivation section that derives second observation parameters proper for the observation condition based on the received observation condition and first observation parameters stored in a storage unit; and a control unit that controls the irradiation unit based on the second observation parameters.

24 Claims, 6 Drawing Sheets

TO IRRADIATION UNIT, DISPLAY DEVICE

*FIG. 5*

OBSERVATION CONDITION

| OBSERVATION CONDITION | | | | | |
|---|---|---|---|---|---|
| ACCELERATION VOLTAGE | BEAM CURRENT | LENS MODE | TYPE OF HOLDER | MATERIAL OF SAMPLE | POSITION OF STAGE |
| x11 | x12 | x13 | x14 | x15 | x16 |

FIG. 6

DATABASE D

| FIRST OBSERVATION PARAMETER | | | | | | SECOND OBSERVATION PARAMETER | | | | | |
|---|---|---|---|---|---|---|---|---|---|---|---|
| ACCELERATION VOLTAGE | BEAM CURRENT | LENS MODE | TYPE OF HOLDER | MATERIAL OF SAMPLE | POSITION OF STAGE | ALIGNER | BEAM SHIFT | OL VALUE | STIGMA VALUE | CONTRAST VALUE | BRIGHTNESS VALUE |
| x21 | x22 | x23 | x24 | x25 | x26 | y11 | y12 | y13 | y14 | y15 | y16 |
| x31 | x32 | x33 | x34 | x35 | x36 | y21 | y22 | y23 | y24 | y25 | y26 |
| ... | ... | ... | ... | ... | ... | ... | ... | ... | ... | ... | ... |

CHARGED PARTICLE BEAM APPARATUS AND METHOD FOR CONTROLLING CHARGED BEAM APPARATUS

CROSS-REFERENCE TO RELATED APPLICATION

This application claims priority from Japanese Patent Application No. 2016-249465, filed on Dec. 22, 2016, the entire subject matters of which is incorporated herein by reference.

BACKGROUND

1. Field of the Invention

The present disclosure relates to a charged particle beam apparatus and a method for controlling the charged particle beam apparatus.

2. Background Art

There has been researched and developed a technology in which a surface or a section of an object is irradiated with a charged particle beam (a beam of a charged particle) to obtain a section image of the section or a surface image of the surface of the object.

In relation to this, there is known a patent publication JP-A-H10(1998)-106474. This document discloses a focused ion beam processing apparatus that includes: an ion source that generates an ion beam; a lens system that focuses the ion beam; an electric variable multi-aperture that limits a current of the ion beam; a stage mounted with a sample to be processed with the ion beam; a detector that detects a secondary particle generated when the sample is irradiated with the ion beam; an ion optical system control unit that controls the electric variable multi-aperture; and a computer system that controls the processing of the sample based on the secondary particle. This focused ion beam processing apparatus performs a plurality of types of processing by storing lens setting, an astigmatism correction value, ion beam optical conditions such as an aperture diameter and an image deviation amount, and a plurality of processing contents in a computer in correspondence with a current amount of the ion beam, selects and sets the optical conditions in accordance with the processing contents.

However, in the processing apparatus in the related art, whenever a sample to be processed is changed, it is necessary to adjust various conditions related to processing and observation of the sample such as optical conditions. As a consequence, in the processing apparatus, there is a case where it is difficult to improve efficiency of work for processing a plurality of samples.

SUMMARY

The present disclosure has been made in view of the above-described circumstances, and one of objects of the present disclosure is to provide a charged particle beam apparatus capable of improving efficiency of sample-based work, which is performed by irradiating a sample with a charged particle beam, and a control method.

According to an exemplary embodiment of the present disclosure, there is provided a charged particle beam apparatus including: an irradiation unit that irradiates a sample with a charged particle beam; an image formation section that forms an image based on a signal obtained by detecting a charged particle generated from the sample due to the irradiation with the charged particle beam; an input reception unit that receives an observation condition; a derivation section that derives second observation parameters proper for the observation condition based on the observation condition received by the input reception unit and first observation parameters stored in a storage unit; and a control unit that controls the irradiation unit based on the second observation parameters.

According to another exemplary embodiment of the present disclosure, there is provided a charged particle beam apparatus including: an irradiation unit that irradiates a sample with a charged particle beam; an input reception unit that receives an observation condition; and a controller that operates to: form an image based on a signal obtained detecting a charged particle generated from the sample due to the irradiation with the charged particle beam; derive second observation parameters proper for the observation condition based on the observation condition received by the input reception unit and first observation parameters store in a storage unit; and control the irradiation unit based on the second observation parameters.

According to another exemplary embodiment of the present disclosure, there is provided a method for controlling a charged particle beam apparatus including an irradiation unit that irradiates a sample with a charged particle beam and an image formation section that forms an image based on a signal obtained by detecting a charged particle generated from the sample due to irradiation with the charged particle beam, the method including: receiving an observation condition; deriving a second observation parameter proper for the observation condition based on the received observation condition and a first observation parameter stored in a storage unit by a derivation section; and controlling the irradiation unit by a control unit based on the derived second observation parameter.

BRIEF DESCRIPTION OF THE DRAWINGS

In the accompanying drawings:

FIG. 5 is a table illustrating an example of observation conditions received in a derivation section from a user via an operation screen through an input reception unit; and FIG. 6 is a table exemplifying one or more first observation parameters stored in a database stored in advance in a storage unit and second observation parameters respectively associated with the first observation parameters.

DETAILED DESCRIPTION

Figure 1:
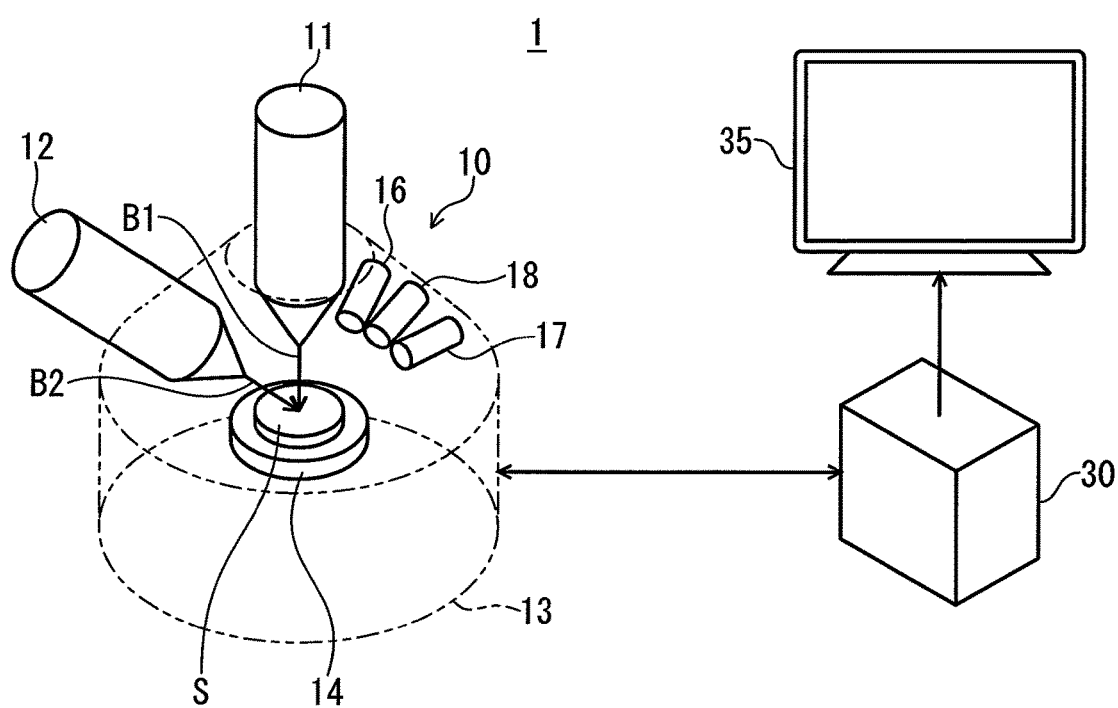
FIG. 1 is a view illustrating an example of a configuration of a charged particle beam apparatus according to an embodiment of the disclosure.

Hereinafter, an embodiment of the present disclosure will be described with reference to the drawings.

An outline of processing performed by a charged particle beam apparatus 1 according to the embodiment will be described.

The charged particle beam apparatus 1, for example, is a charged particle microscope that observes the surface structure of a sample by irradiating the sample with a charged particle beam. The structure includes a chemical composition of the surface, a crystal structure of the surface, and the like. The charged particle beam apparatus 1 may be other system that irradiates the sample with a charged particle beam of a charged particle processing system and the like, which process the sample by etching with a charged particle beam. Furthermore, the charged particle beam apparatus 1 may be a multifunctional peripheral capable of processing a sample by any one or both of a focused ion beam and an electron ion beam as a charged particle beam. The charged particle beam apparatus 1 receives a combination (a set or a parameter group) of one or more of a plurality of parameters, which can be set in the charged particle beam apparatus 1, from a user as observation conditions. Hereinafter, for the convenience of description, each of one or more parameters included in the observation conditions is called an input parameter. The input parameter is a parameter which is determined by a user depending on a sample, the surface structure of which is observed by the charged particle beam apparatus 1. Based on the received observation conditions, the charged particle beam apparatus 1 changes a state of the charged particle beam apparatus 1 to a state depending on the observation conditions.

Specifically, the charged particle beam apparatus 1 stores a database D in advance. The database D is a database in which one or more observation conditions are stored as first observation parameters, respectively. That is, each of the first observation parameters corresponds to a combination of the aforementioned one or more input parameters. The one or more observation conditions, for example, include observation conditions received in the charged particle beam apparatus 1 in the past, observation conditions received in another charged particle beam apparatus 1 in the past, observation conditions registered by a user, and the like. Furthermore, a second observation parameter is associated with each of one or more first observation parameters stored in the database D. The second observation parameters include combinations of parameters, other than the input parameters, among a plurality of parameters which can be set in the charged particle beam apparatus 1. Hereinafter, for the convenience of description, each of one or more parameters included in the second observation parameters is called a derivation parameter. The second observation parameters may include combinations of a part of parameters, other than the input parameters, among a plurality of parameters which can be set in the charged particle beam apparatus 1. The derivation parameters, for example, are combinations of a part or all of one or more beam irradiation parameters representing beam irradiation conditions related to charged particle beam irradiation by the charged particle beam apparatus 1 and one or more detection parameters representing detection conditions related to detection of charged particles, which have been generated from a sample irradiated with a charged particle beam, by the charged particle beam apparatus 1.

The charged particle beam apparatus 1 specifies first observation parameters closest the received observation conditions among one or more first observation parameters stored in the database D stored in advance. Then, the charged particle beam apparatus 1 derives (specifies) second observation parameters, which are associated with the specified first observation parameters, from the database D as second observation parameters proper for the observation conditions. The charged particle beam apparatus 1 sets the received observation conditions and the specified second observation parameters in the charged particle beam apparatus 1. In this way, the charged particle beam apparatus 1 changes a state of the charged particle beam apparatus 1 to a state depending on the observation conditions. That is, the charged particle beam apparatus 1 receives a part (a combination of the aforementioned input parameters) of parameters, which can be set in the charged particle beam apparatus 1, as observation conditions, thereby deriving at least a part (a combination of the aforementioned derivation parameters) of parameters, other than the observation conditions, among the parameters. In this way, the charged particle beam apparatus 1 can reduce effort and time required for parameter setting which is performed by a user whenever a sample is changed. The parameters are parameters which can be set in the charged particle beam apparatus 1. That is, the charged particle beam apparatus 1 can improve efficiency of sample-based work which is performed by irradiating the sample with a charged particle beam.

The charged particle beam apparatus 1 changes the state of the charged particle beam apparatus 1 to the state depending on the observation conditions, irradiates the sample with the charged particle beam, and then detects charged particles generated from the sample by the irradiation with the charged particle beam. The charged particle beam apparatus 1 forms an image based on a signal obtained by detecting the charged particles. The image is a two-dimensional image indicating the surface of the sample in the example.

The sample, for example, is a conductive sample. Alternatively, the sample may be an insulating sample or a semi-conductive sample (a semiconductor sample). Furthermore, an object may be another object instead of the sample, and for example, may be cells constituting a living thing and a living body of a bone and the like. Hereinafter, a detailed description will be provided for a parameter derivation process for deriving the second observation parameters proper for the observation conditions received by the charged particle beam apparatus 1 based on the observation conditions and the first observation parameters stored in the charged particle beam apparatus 1 in advance.

Hereinafter, a configuration of the charged particle beam apparatus 1 will be described. FIG. 1 is a diagram illustrating an example of the configuration of the charged particle beam apparatus 1 according to an embodiment.

The charged particle beam apparatus 1 includes an irradiation unit 10, a control device 30, and a display device 35. In the charged particle beam apparatus 1 of the example, each of the irradiation unit 10, the control device 30, and the display device 35 is configured as a separate element; however, alternatively, a part or all of the irradiation unit 10, the control device 30, and the display device 35 may be integrally configured with one another.

The irradiation unit 10, for example, includes a focused ion beam (FIB) barrel 11, an electron beam (EB) barrel 12, and a sample chamber 13.

The focused ion beam barrel 11 irradiates a focused ion beam B1 obtained by focusing a predetermined type of ions. The focused ion beam B1 is an example of a charged particle beam. The focused ion beam barrel 11, for example, includes an ion source, an ion acceleration unit, and an ion irradiation unit. The ion source generates ions. The ion acceleration unit applies an electric field to the ions generated by the ion source in an ion acceleration direction, thereby accelerating the ions. The ion acceleration direction is a direction along a center axis of the focused ion beam barrel 11 and is a direction directed to an emitting port to which the focused ion beam B1 of the focused ion beam barrel 11 is emitted from the ion source of the focused ion beam barrel 11. The ion irradiation unit includes electrostatic lenses, and applies an electric field to the ions accelerated by the ion acceleration unit through the electrostatic lenses, thereby focusing the ions. Then, the ion irradiation unit irradiates the focused ions from the emitting port in a predetermined irradiation range as the focused ion beam B1. The irradiation range will be described later. The electrostatic lens may be an acceleration type or a deceleration type. Furthermore, the ion irradiation unit includes magnetic field lenses, and may be configured to apply a magnetic field to the ions accelerated by the ion acceleration unit through the magnetic field lenses, thereby focusing the ions.

The focused ion beam barrel 11 is inserted into the sample chamber 13. The sample chamber 13 includes a stage 14 serving as a sample table on which a sample is placed, and a stage driving unit that changes the position and the posture of the stage 14 by a request from the control device 30. When the position and the posture of the stage 14 coincide with a reference position and a reference posture which are a position and a posture decided in advance, the focused ion beam barrel 11 is installed at a position at which the center axis of the focused ion beam barrel 11 is orthogonal to an upper surface of the stage 14. Furthermore, the focused ion beam barrel 11 is installed at a position at which the focused ion beam B1 can be irradiated to a predetermined irradiation area. The irradiation area is an area set on a plane along the upper surface of the stage 14 when the position and the posture of the stage 14 coincide with the reference position and the reference posture. Hereinafter, a description will be provided as an example for the case where the irradiation area is an area set at an inner side of the upper surface of the stage 14 in the above case. Alternatively, the irradiation area may include an area set in a range including partially or entirely the upper surface of the stage 14 in the above case. Furthermore, the irradiation area is always fixed, and is not moved together with the upper surface of the stage 14 even when the stage driving unit changes the position and the posture of the stage 14. That is, the stage driving unit can change the position and the posture of the stage 14, thereby allowing the sample placed on the upper surface of the stage 14 to be relatively translated or inclined with respect to the irradiation area. A sample S illustrated in FIG. 1 is an example of the sample.

The electron beam barrel 12 irradiates an electron beam B2 obtained by focusing electrons. The electron beam B2 is an example of the charged particle beam. The electron beam barrel 12, for example, includes an electron source (for example, an electron gun), an electron acceleration unit, and an electron irradiation unit. The electron source generates electrons. The electron acceleration unit applies an electric field to the electrons generated by the electron source in an electron acceleration direction, thereby accelerating the electrons. The electron acceleration direction is a direction along a center axis of the electron beam barrel 12 and is a direction directed to an emitting port to which the electron beam B2 of the electron beam barrel 12 is emitted from the electron source of the electron beam barrel 12. The electron irradiation unit includes electrostatic lenses, and applies an electric field to the electrons accelerated by the electron acceleration unit through the electrostatic lenses, thereby focusing the electrons. Then, the electron irradiation unit irradiates the focused electrons from the emitting port as the electron beam B2. The electrostatic lens may be an acceleration type or a deceleration type. Furthermore, the electron irradiation unit includes magnetic field lenses, and may be configured to apply a magnetic field to the electrons accelerated by the electron acceleration unit through the magnetic field lenses, thereby focusing the electrons. In this case, the magnetic field lens may be in a semi-in-lens mode in which a lens magnetic field is leaked from the electron beam barrel 12 such that a sample is arranged in the magnetic field, or an out-lens mode in which the lens magnetic field is not leaked from the electron beam barrel 12.

The electron beam barrel 12 is accommodated in the sample chamber 13 together with the focused ion beam barrel 11. When the position and the posture of the stage 14 coincide with the reference position and the reference posture serving as references, the electron beam barrel 12 is installed at a position at which the center axis of the electron beam barrel 12 is inclined with respect to the upper surface of the stage 14 by a predetermined angle. Furthermore, the electron beam barrel 12 is installed at a position at which the electron beam B2 can be irradiated to the aforementioned irradiation area.

Furthermore, the irradiation unit 10 includes a secondary electron detector 16, an EDS detector 17, and an EBSD detector 18. In addition, the irradiation unit 10 may be configured to include other detectors such as a reflection electron detector and a transmission electron detector instead of a part or all of the above elements, or the other detectors such as the reflection electron detector and the transmission electron detector in addition to the part or the whole. The reflection electron detector is a detector that detects at least a part of electrons of the electron beam B2 and electrons reflected by the sample. The transmission electron detector is a detector that detects at least a part of electrons of the electron beam B2 and electrons having transmitted through the sample.

The secondary electron detector 16 detects energy of electrons generated from the sample when the sample is irradiated with the focused ion beam B1. The electrons include recoil electrons scattered by the focused ion beam B1 among the electrons included in the sample, and the like. Furthermore, the secondary electron detector 16 detects energy of electrons generated from the sample when the sample is irradiated with the electron beam B2. The electrons include recoil electrons scattered by the electron beam B2 among the electrons included in the sample, reflection electrons reflected by the sample among the electrons included in the electron beam B2, and the like. The secondary electron detector 16 outputs a signal including information indicating the energy of the detected electrons to the control device 30.

The EDS detector 17 detects energy of an X-ray generated from the sample when the sample is irradiated with the electron beam B2. The X-ray generated from the sample includes a characteristic X-ray unique to each substance constituting the sample. The charged particle beam apparatus 1 can specify the substance constituting the sample by the characteristic X-ray. The EDS detector 17 outputs a signal including information indicating the energy of the detected X-ray to the control device 30.

The EBSD detector 18 detects an intensity distribution (a diffraction pattern) of electrons generated by electron beam backward scattering diffraction occurring on a section of a sample, that is, an EBSD pattern when the sample is a crystalline material and the section of the sample is irradiated with the electron beam B2. The EBSD pattern generated in the section represents a crystal structure (that is, a crystal system, a crystal orientation and the like) of the section. The charged particle beam apparatus 1 can specify a chemical composition of the section by the EBSD pattern. The EBSD detector 18 outputs a signal including information indicating the detected EBSD pattern to the control device 30.

Furthermore, the irradiation unit 10 is communicably connected to the control device 30 by a cable. In this way, each of the focused ion beam barrel 11, the electron beam barrel 12, the stage 14, the secondary electron detector 16, the EDS detector 17, and the EBSD detector 18 provided in the irradiation unit 10 performs an operation based on a control signal acquired from the control device 30. Wired communication via the cable, for example, is performed by standards such as Ethernet (registered trademark) and USB (Universal Serial Bus). Furthermore, the irradiation unit 10 may be configured to be connected to the control device 30 by wireless communication performed by a communication standard such as a Wi-Fi (registered trademark).

In addition, the irradiation unit 10 may be configured not to include any one of the secondary electron detector 16, the EDS detector 17, and the EBSD detector 18. Furthermore, the irradiation unit 10 may be configured to include another detector instead of any one of the secondary electron detector 16, the EDS detector 17, and the EBSD detector 18. Furthermore, the irradiation unit 10 may be configured to include two or more detectors instead of all the secondary electron detector 16, the EDS detector 17, and the EBSD detector 18.

The control device 30, for example, is an information processing apparatus such as a desktop PC (Personal Computer), a note PC, and a workstation. Alternatively, the control device 30 may include other information processing apparatus such as a tablet PC, a multifunction portable telephone (a smart phone), and a PDA (Personal Data Assistant).

The control device 30 controls the irradiation unit 10. For example, the control device 30 allows the irradiation unit 10 to irradiate the surface of the sample with a charged particle beam. Furthermore, the control device 30 allows the irradiation unit 10 to detect charged particles generated from the surface of the sample by the irradiation with the charged particle beam by the irradiation unit 10. The control device 30 acquires a signal obtained by detecting the charged particles from the irradiation unit 10 and forms (generates) an image representing the surface based on the acquired signal. The control device 30 allows the display device 35 to display the formed image.

Furthermore, the control device 30 controls the irradiation unit 10 to perform sample-based work which is performed by irradiating the sample with the charged particle beam. The sample-based work, for example, includes work for etching the surface of the sample, work for generating the image representing the surface of the sample and allowing the display device 35 to display the generated image as described above. Alternatively, the sample-based work may include another work which is performed by irradiating the sample with the charged particle beam.

Furthermore, the control device 30 receives the aforementioned observation conditions. Based on the received observation conditions and one or more first observation parameters stored in the database D stored in advance, the control device 30 derives second observation parameters proper for the observation conditions. That is, the control device 30 performs the aforementioned parameter derivation process. The database D may be configured to be acquired by the control device 30 from a server connected to the control device 30 via a network, instead of being stored in the control device 30 in advance. In this case, the control device 30 acquires the database D from the server in advance and stores the database D. Based on the received observation conditions and the derived second observation parameters, the control device 30 controls the irradiation unit 10.

In addition, the control device 30 can perform another process such as a process for allowing the irradiation unit 10 to form a deposition film on the sample so as to protect the surface of the sample; however, hereinafter, a description for processes to be performed by the control device 30, other than processes necessary for describing the parameter derivation process, will be omitted.

The display device 35, for example, is a display provided with a liquid crystal display panel or an organic EL (Electro Luminescence) display panel as the aforementioned display unit. The display device 35 displays various images acquired from the control device 30 on the display unit. In addition, the display device 35 may be configured to include a touch panel. In this case, the display device 35 may include a tablet type display with a touch panel or a stationary type display with a touch panel. Furthermore, in this case, the display device 35 can operate the control device 30 based on an operation received from a user.

Figure 2:
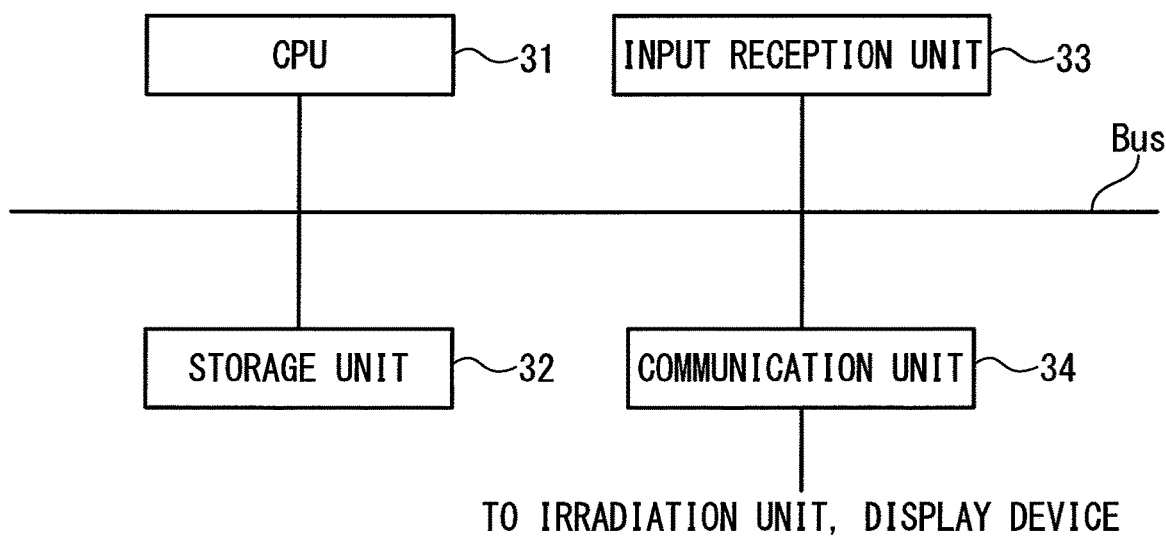
FIG. 2 is a diagram illustrating an example of a hardware configuration of a control device.

Hereinafter, a hardware configuration of the control device 30 will be described with reference to FIG. 2. FIG. 2 is a diagram illustrating an example of the hardware configuration of the control device 30.

The control device 30, for example, includes a CPU (Central Processing Unit) 31, a storage unit 32, an input reception unit 33, and a communication unit 34. These elements are communicably connected to one another via a bus (shown as Bus in FIG. 2). The control device 30 communicates with the irradiation unit 10 and the display device 35 via the communication unit 34.

The CPU 31 executes various programs stored in the storage unit 32. The storage unit 32, for example, includes a HDD (Hard Disk Drive), a SDD (Solid State Drive), an EEPROM (Electrically Erasable Programmable Read-Only Memory), a ROM (Read-only Memory), a RAM (Random Access Memory) and the like. The storage unit 32 may include an external mounting type storage device connected by a digital input/output port and the like, such as a USB, instead of being embedded in the control device 30. The storage unit 32 stores various types of information, images, various programs, the database D and the like, which are processed by the control device 30.

The input reception unit 33, for example, is an input device such as a keyboard, a mouse, and a touchpad. The input reception unit 33 may include another input device such as a touch panel integrally configured with the display unit provided in the display device 35 when the control device 30 is integrally configured with the display device 35.

The communication unit 34, for example, includes a digital input/output port such as a USB, an Ethernet (registered trademark) port and the like.

Figure 3:
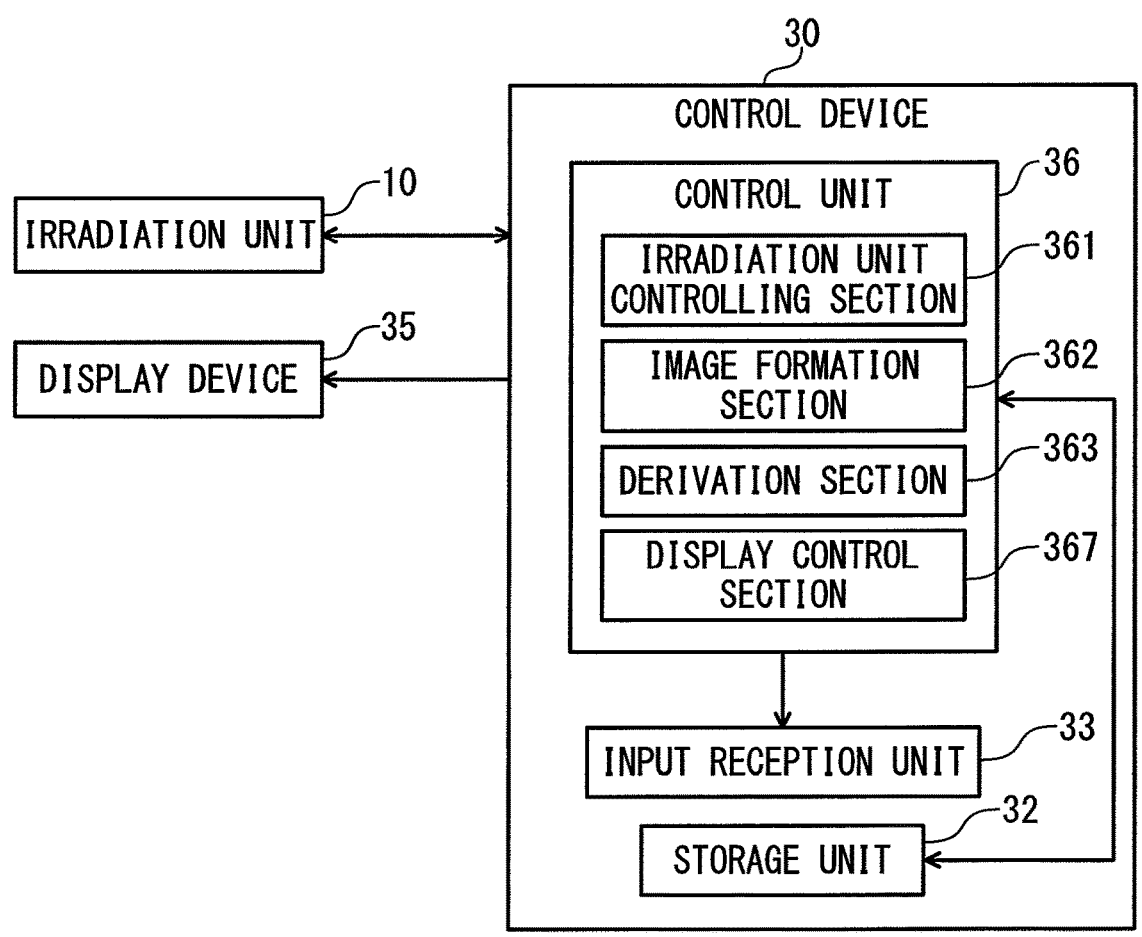
FIG. 3 is a diagram illustrating an example of a functional configuration of the control device.

Hereinafter, a functional configuration of the control device 30 will be described with reference to FIG. 3. FIG. 3 is a diagram illustrating an example of the functional configuration of the control device 30.

The control device 30 includes the storage unit 32, the input reception unit 33, and a control unit 36.

The control unit 36 controls the entire control device 30. The control unit 36 includes an irradiation unit controlling section 361, an image formation section 362, a derivation section 363, and a display control section 367. These functional sections provided in the control unit 36, for example, are implemented when the CPU 31 executes various programs stored in the storage unit 32. Furthermore, a part or all of the functional sections may be hardware functional sections such as a LSI (Large Scale Integration) and an ASIC (Application Specific Integrated Circuit).

The irradiation unit controlling section 361 controls the entire irradiation unit 10 The irradiation unit controlling section 361 sets, in the irradiation unit 10, the observation conditions received from a user by the input reception unit 33 and second observation parameters derived by the derivation section 363. Based on the set observation conditions and second observation parameters, the irradiation unit controlling section 361 allows a charged particle beam to be irradiated to any one or both of the focused ion beam barrel 11 and the electron beam barrel 12. Furthermore, from the secondary electron detector 16 the irradiation unit controlling section 361 acquires a signal obtained by detecting the electron energy with the secondary electron detector 16. Furthermore, from the EDS detector 17, the irradiation unit controlling section 361 acquires a signal obtained by detecting the X-ray energy with the EDS detector 17. Furthermore, from the EBSD detector 18, the irradiation unit controlling section 361 acquires a signal obtained by detecting the EBSD pattern with the EBSD detector 18.

The image formation section 362 forms a SIM image, a SEM image and the like based on the signal acquired from the secondary electron detector 16 by the irradiation unit controlling section 361. Furthermore, the image formation section 362 forms an EDS map based on the signal acquired from the EDS detector 17 by the irradiation unit controlling section 361. Furthermore, the image formation section 362 forms an EBSD map based on the signal acquired from the EBSD detector 18 by the irradiation unit controlling section 361.

Based on the observation conditions received from a user by the input reception unit 33 and the database D stored in the storage unit 32 in advance, the derivation section 363 derives the second observation parameters proper for the observation conditions.

The display control section 367 generates various screens to be displayed on the display unit provided in the display device 35. The display control section 367 outputs the generated screens to the display device 35 and allows the display unit to display the screens. Furthermore, the display control section 367, for example, allows the display unit to display images such as the SIM image, the SEM image, the EDS map, and the EBSD map formed by the image formation section 362.

Figure 4:
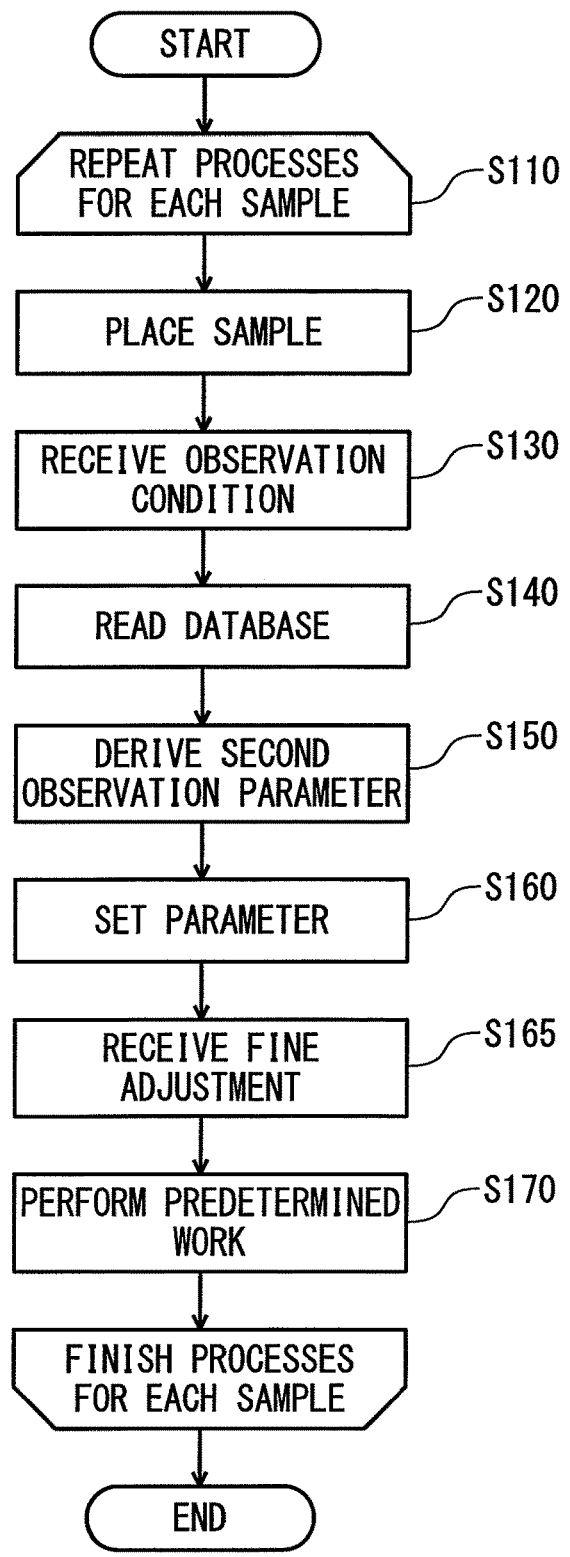
FIG. 4 is a flowchart illustrating an example of the flow of a parameter derivation process performed by the control device.

Hereinafter, the parameter derivation process performed by the control device 30 will be described with reference to FIG. 4. FIG. 4 is a flowchart illustrating an example of the flow of the parameter derivation process performed by the control device 30.

The control device 30 repeats processes of steps S120 to S170 for each of one or more samples decided in advance (step S110).

The control device 30 waits until the sample selected by a user in step S110 is placed on an upper surface of the stage 14 by the user (step S120). Specifically, the control device 30 waits until an operation, which has been received from the user and has started the parameter derivation process, is received via an operation screen displayed in advance on the display unit of the display device 35 by the display control section 367. The operation screen is a screen used when the user operates the control device 30. When the operation is received, the control device 30 determines that the sample is placed on the upper surface by the user and starts the process of step S130.

After the process of step S120 is performed, the derivation section 363 receives observation conditions from the user via the operation screen by the input reception unit 33 (step S130). Specifically, in the example, the derivation section 363 receives combinations of an acceleration voltage, a beam current, a lens mode, a type of a holder, a material of a sample, and the position of the stage 14 among a plurality of parameters, which can be set in the charged particle beam apparatus 1, as the observation conditions. The observation conditions may include combinations of other parameters, instead of the combinations of the above parameters.

In the example, the acceleration voltage is a voltage for accelerating a predetermined type of ions to the focused ion beam barrel 11 or a voltage for accelerating electrons to the electron beam barrel 12.

In the example, the beam current is a beam current of the focused ion beam B1 to be irradiated by the focused ion beam barrel 11 or a beam current of the electron beam B2 to be irradiated by the electron beam barrel 12.

In the example, the lens mode is a value representing an operation mode of an object lens of the electrostatic lenses provided in the focused ion beam barrel 11 or a value representing an operation mode of an object lens of the electrostatic lenses (or the magnetic field lenses) provided in the electron beam barrel 12. Each of the object lenses provided in the focused ion beam barrel 11 and the electron beam barrel 12 has a plurality of operation modes. Among the plurality of operation modes, in operation modes determined to be similar to one another by a user, values close to one another (values with a small difference) are associated with one another as values representing the operation modes.

In the example, the type of the holder is a value representing the type of a holder that holds the sample when the sample is placed on the upper surface of the stage 14. When placing the sample on the upper surface of the stage 14, the user allows the sample to be held to a holder with a type selected by the user and mounts the holder on the upper surface, thereby placing the sample on the upper surface. Among a plurality of types, in types determined to be similar to one another by the user, values close to one another (values with a small difference) are associated with one another as values representing the types.

In the example, the position of the stage 14 is a position of the stage 14 represented by a three-dimensional coordinate system 1C associated with a predetermined position of the charged particle beam apparatus 1.

Furthermore, each of the acceleration voltage, the beam current, the lens mode, the type of the holder, the material of the sample, and the position of the stage 14 is associated with a priority indicating a comparison order when the observation conditions and the first observation parameters stored in the database D are compared with each other. The priority decreases in the order of the acceleration voltage, the beam current, the lens mode, the type of the holder, the material of the sample, and the position of the stage 14. That is, the highest priority is associated with the acceleration voltage and the lowest priority is associated with the position of the stage 14.

FIG. 5 is a table illustrating an example of the observation conditions received in the derivation section 363 from the user via the operation screen through the input reception unit 33. As illustrated in FIG. 5, the derivation section 363 receives combinations of the acceleration voltage, the beam current, the lens mode, the type of the holder, the material of the sample, and the position of the stage 14 among the plurality of parameters, which can be set in the irradiation unit 10 as the observation conditions.

After the process of step S130 is performed, the derivation section 363 reads the database D stored in advance in the storage unit 32 from the storage unit 32 (step S140). Hereinafter, the process of step S140 will be described.

The database D stored in advance in the storage unit 32 stores a plurality of first observation parameters and second observation parameters respectively associated with the first observation parameters as illustrated in FIG. 6. FIG. 6 is a table exemplifying one or more first observation parameters stored in the database D stored in advance in the storage unit 32 and the second observation parameters respectively associated with the first observation parameters.

The first observation parameters are combinations of parameters having the same type as that of the input parameters received in the image formation section 362 from the user among the plurality of parameters stored in the database D stored in advance in the storage unit 32. That is, in the example, the first observation parameters include each of the acceleration voltage, the beam current, the lens mode, the type of the holder, the material of the sample, and the position of the stage 14. Furthermore, each of the acceleration voltage, the beam current, the lens mode, the type of the holder, the material of the sample, and the position of the stage 14 included in the first observation parameters is associated with the aforementioned priority. The priority decreases in the order of the acceleration voltage, the beam current, the lens mode, the type of the holder, the material of the sample, and the position of the stage 14. That is, the highest priority is associated with the acceleration voltage and the lowest priority is associated with the position of the stage 14.

In the example, the second observation parameters are combinations of each of an aligner, a beam shift, an OL value, and a stigma value which are set in the focused ion beam barrel 11 or the electron beam barrel 12 and each of a contrast value and a brightness value which are set in a part or all of the secondary electron detector 16, the EDS detector 17, and the EBSD detector 18. Each of the aligner, the beam shift, the OL value, and the stigma value, which are set in the focused ion beam barrel 11 or the electron beam barrel 12, is an example of the aforementioned beam irradiation parameters. Furthermore, each of the contrast value and the brightness value, which are set in a part or all of the secondary electron detector 16, the EDS detector 17, and the EBSD detector 18, is an example of the aforementioned detection conditions.

After the process of step S140 is performed, the derivation section 363 derives the second observation parameters proper for the observation conditions based on the observation conditions received from the user in step S130 and the first observation parameters stored in the database D read from the storage unit 32 in step S140 (step S150). Hereinafter, the process of step S150 will be described.

The derivation section 363 compares the observation conditions received from the user in step S130 with one or more first observation parameters stored in the database D read from the storage unit 32 in step S140. More specifically, the derivation section 363 compares the input parameters included in the observation conditions with the input parameters included in the first observation parameters in the order of the priority associated with each input parameter.

For example, the derivation section 363 calculates each of differences between input parameters with the highest priority among the input parameters included in the received observation conditions and input parameters with the highest priority among the input parameters included in the first observation parameters. Then, the derivation section 363 specifies first observation parameters including an input parameter with the smallest calculated difference. Next, the derivation section 363 calculates each of differences between input parameters with a second highest priority among the input parameters included in the received observation conditions and input parameters with a second highest priority among the input parameters included in the specified one or more first observation parameters. Then, the derivation section 363 specifies first observation parameters including an input parameter with the smallest calculated difference. The derivation section 363 repeats such a process until the process using parameters with the lowest priority of the parameters representing the observation conditions is completed. The derivation section 363 specifies finally remaining first observation parameters as first observation parameters closest the observation conditions. Then, the derivation section 363 derives second observation parameters, which are associated with the specified first observation parameters, as second observation parameters, which likely correspond to the observation conditions, that is, the second observation parameters proper for the observation conditions. When a plurality of first observation parameters finally remain, the derivation section 363 may be configured to select first observation parameters randomly selected from the plurality of first observation parameters as first observation parameters closest the observation conditions, to select first observation parameters satisfying predetermined conditions among the plurality of first observation parameters as the first observation parameters closest the observation conditions, or to select first observation parameters selected from the plurality of first observation parameters by other methods as the first observation parameters closest the observation conditions.

In addition, the derivation section 363 may be configured to derive second observation parameters from the database D by other methods such as a configuration for deriving the second observation parameters, which likely correspond to the observation conditions, from the database D based on a machine learning algorithm allowing the database D to learn and the received observation conditions.

After the process of step S150 is performed, the irradiation unit controlling section 361 sets, in the irradiation unit 10, the second observation parameters derived in step S150 and the observation conditions received in step S130 (step S160). Specifically, the irradiation unit controlling section 361 sets each of the acceleration voltage and the beam current included in the observation conditions in any one or both selected by the user from the focused ion beam barrel 11 and the electron beam barrel 12. Furthermore, the irradiation unit controlling section 361 sets the lens mode included in the observation conditions in the object lens provided in any one or both selected by the user from the focused ion beam barrel 11 and the electron beam barrel 12. Furthermore, the irradiation unit controlling section 361 stores the material of the sample included in the observation conditions in the storage unit 32. Furthermore, based on the position of the stage 14 included in the observation conditions, the irradiation unit controlling section 361 controls the stage driving unit provided in the stage 14 and allows the position of the stage 14 to coincide with a corresponding position. Furthermore, the irradiation unit controlling section 361 sets each of the aligner, the beam shift, the OL value, and the stigma value included in the second observation parameters in any one or both selected by the user from the focused ion beam barrel 11 and the electron beam barrel 12. Furthermore, the irradiation unit controlling section 361 sets each of the contrast value and the brightness value included in the second observation parameters in any one or both selected by the user from the secondary electron detector 16, the EDS detector 17, and the EBSD detector 18.

Next, the irradiation unit controlling section 361 receives each input parameter set in the irradiation unit 10 in step S160 and an operation for finely adjusting each derivation parameter from the user via the operation screen by the input reception unit 33 (step S165). Specifically, the irradiation unit controlling section 361 waits until the operation is received. When an operation for ending the fine adjustment is received from the user via the operation screen by the input reception unit 33, the irradiation unit controlling section 361 performs the process of step S170.

After the process of step S165 is performed, the irradiation unit controlling section 361 controls the irradiation unit 10 and irradiates the sample placed on the upper surface of the stage 14 with the charged particle beam, thereby performing predetermined work according to the sample (step S170). Thereafter, the user proceeds to step S130 and selects a next sample.

As described above, the charged particle beam apparatus 1 according to the aforementioned embodiment irradiates a sample with a charged particle beam (in the example, the focused ion beam B1, the electron beam B2 and the like) by an irradiation unit (in the example, the irradiation unit 10), detects charged particles generated from the sample by the irradiation with the charged particle beam, and forms an image based on a signal obtained by detecting the charged particles. Furthermore, the charged particle beam apparatus 1 receives observation conditions, derives second observation parameters proper for the observation conditions based on the received observation conditions and first observation parameters stored in a storage unit (in the example, the storage unit 32 or a server on a network), and controls the irradiation unit based on the second observation parameters. In this way, the charged particle beam apparatus 1 can improve efficiency of sample-based work which is performed by irradiating the sample with the charged particle beam.

Furthermore, the charged particle beam apparatus 1 receives, as the observation conditions, combinations of a part or all of an acceleration voltage for accelerating the charged particle beam, a beam current of the charged particle beam, a lens mode that is an operation mode of an object lens for focusing the charged particle beam, a type of a holder for holding the sample, a material of the sample, and a stage position that is a position of a stage for placing the sample. Furthermore, in the charged particle beam apparatus 1, the storage unit stores the combinations as the first observation parameters. In this way, based on the combinations of the acceleration voltage, the beam current, the lens mode, the type of the holder, the material of the sample, and the position of the stage, the charged particle beam apparatus 1 can improve the efficiency of the sample-based work which is performed by irradiating the sample with the charged particle beam.

Furthermore, in the charged particle beam apparatus 1, the storage unit stores, as the second observation parameters, combinations of a part or all of one or more beam irradiation parameters representing beam irradiation conditions related to charged particle beam irradiation by the irradiation unit and one or more detection parameters representing detection conditions related to detection of charged particles generated from the sample due to irradiation with the charged particle beam. In this way, based on the combinations of a part or all of the beam irradiation parameters and the detection parameters, the charged particle beam apparatus 1 can improve the efficiency of the sample-based work which is performed by irradiating the sample with the charged particle beam.

Furthermore, in the charged particle beam apparatus 1, the beam irradiation parameters are combinations of a part or all of an aligner, a beam shift, an OL value, and a stigma value which are set in the irradiation unit when the irradiation unit is allowed to irradiate the charged particle beam, and the detection conditions are combinations of any one or both of a contrast value and a brightness value. In this way, the charged particle beam apparatus 1 can derive a part or all of the aligner, the beam shift, the OL value, and the stigma value, the contrast value, and the brightness value based on the received observation conditions.

Furthermore, in the charged particle beam apparatus 1, the storage unit stores a database (in the example, the database D) in which the first observation parameters and the second observation parameters are associated with each other. Furthermore, based on the received observation conditions and the first observation parameters, the charged particle beam apparatus 1 derives second observation parameters, which likely correspond to the observation conditions, among the second observation parameters included in the database as the second observation parameters proper for the observation conditions. In this way, the charged particle beam apparatus 1 can allow a user to omit work for specifying the second observation parameters proper for the received observation conditions.

Furthermore, the charged particle beam apparatus 1 specifies first observation parameters closest the received observation conditions among the first observation parameters included in the database, and derives second observation parameters, which are associated with the specified first observation parameters, as the second observation parameters likely corresponding to the observation conditions. In this way, based on the first observation parameters closest the received observation conditions among the first observation parameters included in the database, the charged particle beam apparatus 1 can allow a user to omit the work for specifying the second observation parameters proper for the received observation conditions.

Furthermore, in the charged particle beam apparatus 1, a priority is associated with each of the parameters included in the first observation parameters included in the database. Furthermore, based on the priority and the received observation conditions, the charged particle beam apparatus 1 specifies the first observation parameters closest the observation conditions among the first observation parameters included in the database. In this way, based on the priority, the charged particle beam apparatus 1 can allow a user to omit the work for specifying the second observation parameters proper for the received observation conditions.

Furthermore, the charged particle beam apparatus 1 derives the second observation parameters, which likely correspond to the observation conditions, from the database based on a machine learning algorithm allowing the database to learn and the received observation conditions. In this way, based on the machine learning algorithm, the charged particle beam apparatus 1 can allow a user to omit the work for specifying the second observation parameters proper for the received observation conditions.

Furthermore, the charged particle beam apparatus 1 reads the database from a storage unit (in the example, the storage unit 32) provided therein. In this way, based on the database stored in the storage unit in advance, the charged particle beam apparatus 1 can improve the efficiency of the sample-based work which is performed by irradiating the sample with the charged particle beam.

Furthermore, the charged particle beam apparatus 1 acquires the database from a storage unit (in the example, a server on a network) via the network. In this way, based on the database acquired from the storage unit, the charged particle beam apparatus 1 can improve the efficiency of the sample-based work which is performed by irradiating the sample with the charged particle beam.

Furthermore, in the charged particle beam apparatus 1, the database stored in the storage unit is a database in which the first observation parameters and the second observation parameters when the irradiation unit irradiated the sample with the charged particle beam in the past are associated with each other. In this way, based on the database in which the first observation parameters and the second observation parameters when the irradiation unit irradiated the sample with the charged particle beam in the past are associated with each other, the charged particle beam apparatus 1 can improve the efficiency of the sample-based work which is performed by irradiating the sample with the charged particle beam.

In the above description, the embodiment according to the present disclosure has been described in detail with reference to the drawings. The charged particle beam apparatus 1 may have configurations which is not limited to the above-descried embodiment and may be subjected to modification, replacement, deletion and the like without departing from the spirit of the present disclosure.

Furthermore, a program for realizing the functions of an arbitrary element in the device (for example, the control device 30) described above may be recorded on a computer-readable recording medium and the program may be read and executed by a computer system. In addition, the "computer system" herein is assumed to include hardware such as an OS (Operating System) and a peripheral device. Furthermore, the "computer-readable recording medium" indicates a portable medium such as a flexible disk, a magneto-optical disc, a ROM, and a CD (Compact Disk)-ROM, and a storage device such as a hard disk embedded in the computer system. Moreover, the "computer-readable recording medium" is assumed to include a medium for holding a program for a constant time period such as a volatile memory (RAM) in the computer system serving as a server or a client in the case of transmitting the program via a network such as the Internet or a communication line such as a telephone infrastructure.

Furthermore, the aforementioned program may be transmitted from a computer system having stored the program in a storage device and the like to other computer systems via a transmission medium or a transmission wave of the transmission medium. In this case, the "transmission medium" for transmitting the program indicates a medium having an information transmission function such as a network (a communication network) of the Internet and the like and a communication line of a telephone line and the like.

Furthermore, the aforementioned program may be a program for realizing some of the aforementioned functions. Moreover, the aforementioned program may also be a program capable of realizing the aforementioned functions by a combination with a program previously recorded in the computer system, that is, a difference file (a difference program).

According to the present disclosure, there is provided a charged particle beam apparatus capable of improving efficiency of sample-based work which is performed by irradiating a sample with a charged particle beam, and a method for controlling the charged particle beam apparatus.

What is claimed is:
1. A charged particle beam apparatus comprising:
an irradiation unit that irradiates a sample with a charged particle beam;
an image formation section that forms an image based on a signal obtained by detecting a charged particle generated from the sample due to the irradiation with the charged particle beam;
an input reception unit that receives an observation condition;
a derivation section that derives second observation parameters proper for the observation condition based on the observation condition received by the input, reception unit and first observation parameters stored in a storage unit; and
a control unit that controls the irradiation unit based on the second observation parameters.

2. The charged particle beam apparatus according to claim 1,
wherein the input reception unit receives, as the observation condition, a combination of a part or all of an acceleration voltage for accelerating the charged particle beam, a beam current of the charged particle beam, a lens mode that is an operation mode of an object lens for focusing the charged particle beam, a type of a holder for holding the sample, a material of the sample, and a stage position that is a position of a stage for placing the sample, and
wherein the storage unit stores the combination as the first observation parameters.

3. The charged particle beam apparatus according to claim 1,
wherein the storage unit stores, as the second observation parameters, a combination of a part or all of one or more beam irradiation parameters representing a beam irradiation condition related to the irradiation with the charged particle beam by the irradiation unit and one or more detection parameters representing a detection condition related to detection of the charged particle.

4. The charged particle beam apparatus according to claim 3,
wherein the beam irradiation parameter includes a combination of a part or all of an aligner, a beam shift, an OL value, and a stigma value which are set in the irradiation unit when the irradiation unit is allowed to irradiate the sample with the charged particle beam, and
wherein the detection condition is a combination of any one or both of a contrast value and a brightness value.

5. The charged particle beam apparatus according to claim 1,
wherein the storage unit stores a database in which the first observation parameters and the second observation parameters are associated with each other, and
wherein the derivation section derives the second observation parameters, which likely correspond to the observation condition among the second observation parameters included in the database, as the second observation parameters proper for the observation condition based on the received observation condition and the first observation parameters.

6. The charged particle beam apparatus according to claim 5,
wherein the derivation section specifies the first observation parameters closest the received observation conditions among the first observation parameters included in the database, and derives the second observation parameters, which are associated with the specified first observation parameters, as the second observation parameters likely corresponding to the observation condition.

7. The charged particle beam apparatus according to claim 6,
wherein a priority is associated with each of parameters included in the first observation parameters included in the database, and
wherein the derivation section specifies the first observation parameters closest the observation conditions among the observation parameters included in the database based on the priority and the received observation conditions.

8. The charged particle beam apparatus according to claim 5,
wherein the derivation section derives the second observation parameters, which likely correspond to the observation condition, from the database based on a machine learning algorithm allowing the database to learn and the received observation condition.

9. The charged particle beam apparatus according to claim 5 further comprising:
a database storage unit that stores the database,
wherein the derivation section reads the database from the database storage unit.

10. The charged particle beam apparatus according to claim 5,
wherein the derivation section acquires the database from the database storage unit via a network.

11. The charged particle beam apparatus according to claim 5,
wherein the database includes a database in which the first observation parameters and the second observation parameters when the irradiation unit irradiated the sample with the charged particle beam in the past are associated with each other.

12. A charged particle beam apparatus comprising:
an irradiation unit that irradiates a sample with a charged particle beam;
an input reception unit that receives an observation condition; and
a controller that operates to:
form an image based on a signal obtained detecting a charged particle generated from the sample due to the irradiation with the charged particle beam;
derive second observation parameters proper for the observation condition based on the observation condition received by the input reception unit and first observation parameters stored in a storage unit; and
control the irradiation unit based on the second observation parameters.

13. The charged particle beam apparatus according to claim 12,
wherein the input reception unit receives, as the observation condition, a combination of a part or all of an acceleration voltage for accelerating the charged particle beam, a beam current of the charged particle beam, a lens mode that is an operation mode of an object lens for focusing the charged particle beam, a type of a holder for holding the sample, a material of the sample, and a stage position that is a position of a stage for placing the sample, and
wherein the storage unit stores the combination as the first observation parameters.

14. The charged particle beam apparatus according to claim 12,
wherein the storage unit stores, as the second observation parameters, a combination of a part or all of one or more beam irradiation parameters representing a beam irradiation condition related to the irradiation with the charged particle beam by the irradiation unit and one or more detection parameters representing a detection condition related to detection of the charged particle.

15. The charged particle beam apparatus according to claim 14,
wherein the beam irradiation parameter includes a combination of a part or all of an aligner, a beam shift, an OL value, and a stigma value which are set in the irradiation unit when the irradiation unit is allowed to irradiate the sample with the charged particle beam, and
wherein the detection condition is a combination of any one or both of a contrast value and a brightness value.

16. The charged particle beam apparatus according to claim 12,
wherein the storage unit stores a database in which the first observation parameters and the second observation parameters are associated with each other, and
wherein the controller derives the second observation parameters, which likely correspond to the observation condition among the second observation parameters included in the database, as the second observation parameters proper for the observation condition based on the received observation condition and the first observation parameters.

17. The charged particle beam apparatus according to claim 16,
wherein the controller specifies the first observation parameters closest the received observation conditions among the first observation parameters included in the database, and derives the second observation parameters, which are associated with the specified first observation parameters, as the second observation parameters likely corresponding to the observation condition.

18. The charged particle beam apparatus according to claim 17,
wherein a priority is associated with each of parameters included in the first observation parameters included in the database, and
wherein the controller specifies the first observation parameters closest the observation conditions among the first observation parameters included in the database based on the priority and the received observation conditions.

19. The charged particle beam apparatus according to claim 16,
wherein the controller derives the second observation parameters, which likely correspond to the observation condition, from the database based on a machine learning algorithm allowing the database to learn and the received observation condition.

20. The charged particle beam apparatus according to claim 16 further comprising:
a database storage unit that stores the database,
wherein the controller reads the database from the database storage unit.

21. The charged particle beam apparatus according to claim 16,
wherein the controller acquires the database from the database storage unit via a network.

22. The charged particle beam apparatus according to claim 16,
wherein the database includes a database in which the first observation parameters and the second observation parameter when the irradiation unit irradiated the sample with the charged particle beam in the past are associated with each other.

23. A method for controlling a charged particle beam apparatus including an irradiation unit that irradiates a sample with a charged particle beam and an image formation section that forms an image based on a signal obtained by detecting a charged particle generated from the sample due to irradiation with the charged particle beam, the method comprising:

receiving an observation condition;

deriving a second observation parameter proper for the observation condition based on the received observation condition and a first observation parameter stored in a storage unit by a derivation section; and controlling the irradiation unit by a control unit based on the derived second observation parameter.

24. The method according to claim 23, wherein the storage unit includes a database in which the first observation parameter and the second observation parameter obtained when the irradiation unit irradiated the sample with the charged particle beam in the past are associated with each other.

\* \* \* \* \*